United States Patent [19]

Horányi et al.

[11] Patent Number: 5,202,018

[45] Date of Patent: Apr. 13, 1993

[54] PROCESS FOR ELECTROCHEMICAL DISSOLUTION OF SEMICONDUCTORS

[75] Inventors: Tamás Horányi; Péter Tüttö; Gàbor Endrédi, all of Budapest, Hungary

[73] Assignee: SEMILAB Felvezeto Fizikai Labortorium Rt., Budapest, Hungary

[21] Appl. No.: 728,609

[22] Filed: Jul. 11, 1991

[30] Foreign Application Priority Data

Jul. 12, 1990 [HU] Hungary ............................. 4176/90

[51] Int. Cl.$^5$ ................................................ C25F 3/12
[52] U.S. Cl. .............................. 204/129.2; 204/129.3; 204/129.4; 204/DIG. 9
[58] Field of Search ............. 204/129.2, 129.3, 129.43, 204/DIG. 9

[56] References Cited

U.S. PATENT DOCUMENTS

| | | | |
|---|---|---|---|
| 4,028,207 | 6/1977 | Faktor et al. ................. | 204/129.2 X |
| 4,154,663 | 5/1979 | Adams ............................... | 204/129.3 |
| 4,168,212 | 9/1979 | Faktor et al. ................. | 204/129.3 X |
| 4,369,099 | 1/1983 | Kohl et al. ..................... | 204/DIG. 9 |
| 4,995,939 | 2/1991 | Ferenczi et al. .............. | 204/129.2 X |

FOREIGN PATENT DOCUMENTS 2532329 3/1984 France .
1475993 4/1989 U.S.S.R. .

OTHER PUBLICATIONS

PCT International Search Report PCT/HU91/00034.

*Primary Examiner*—Donald R. Valentine
*Attorney, Agent, or Firm*—Flehr, Hohbach, Test, Albritton & Herbert

[57] ABSTRACT

The invention relates to the electrochemical dissolution of semiconductors by alternating application of anodic and cathodic direct currents to an electrode formed by contacting a semiconductor material with an electrolyte.

24 Claims, 4 Drawing Sheets

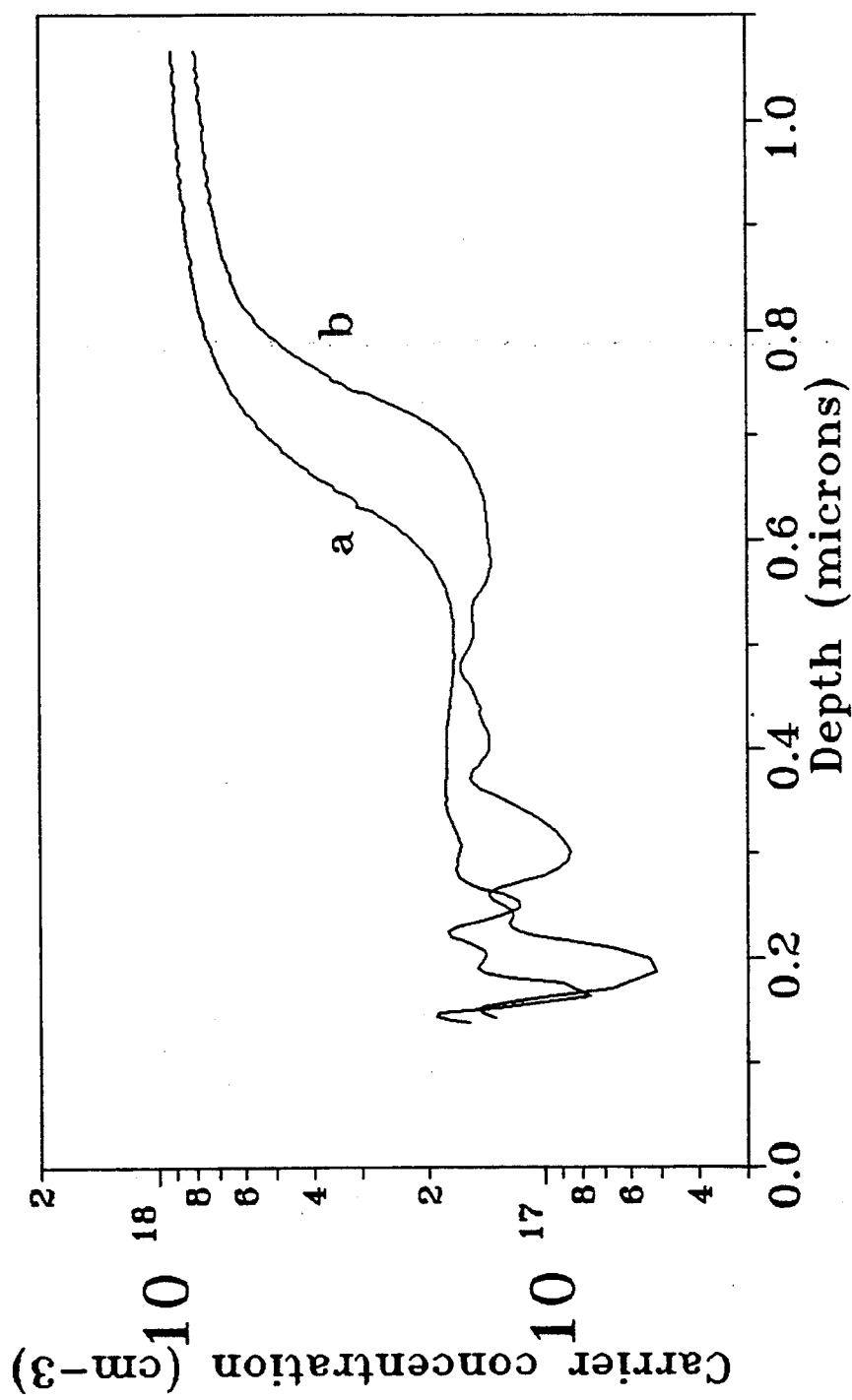
FIGURE 2/1

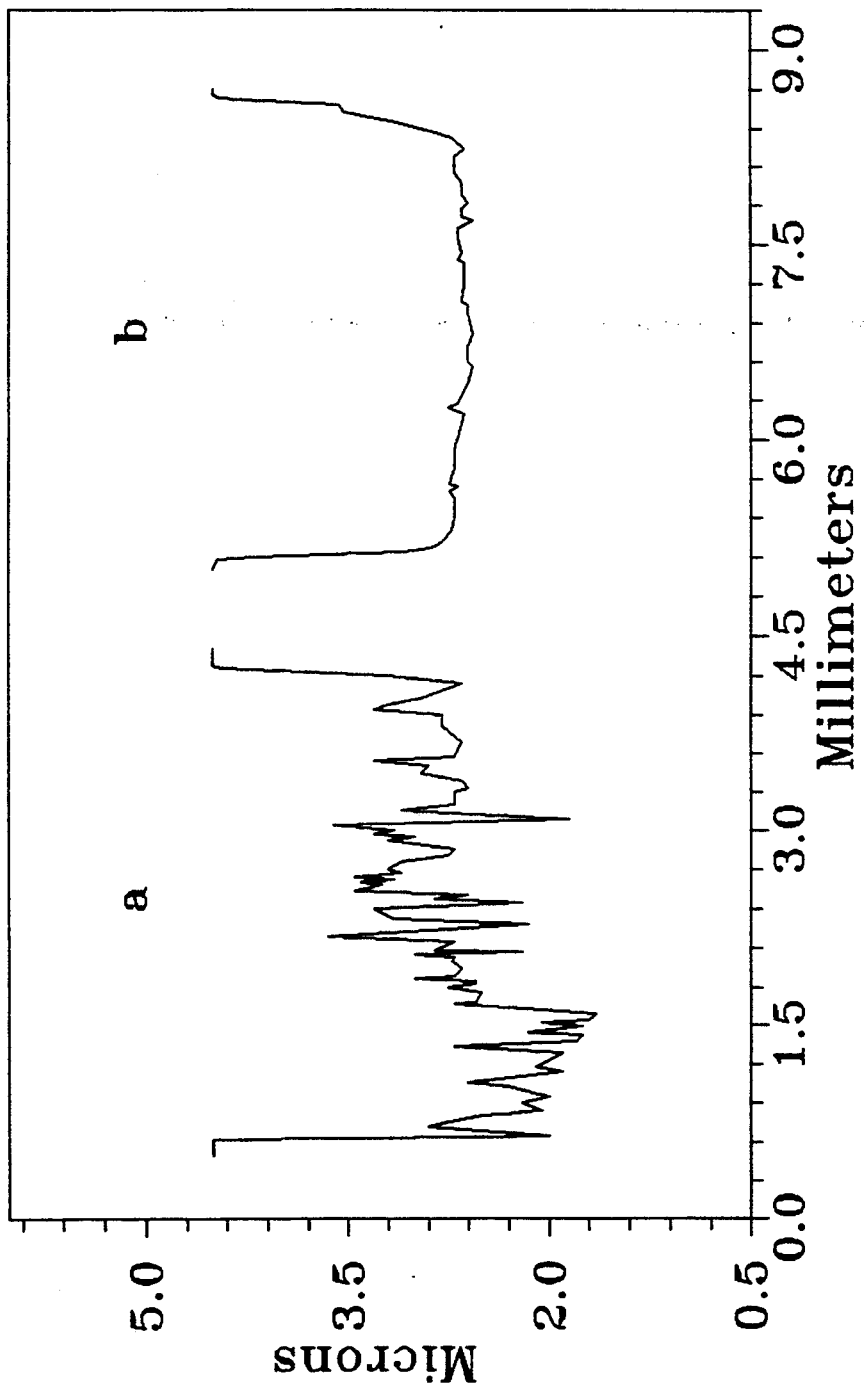
FIGURE 2/2

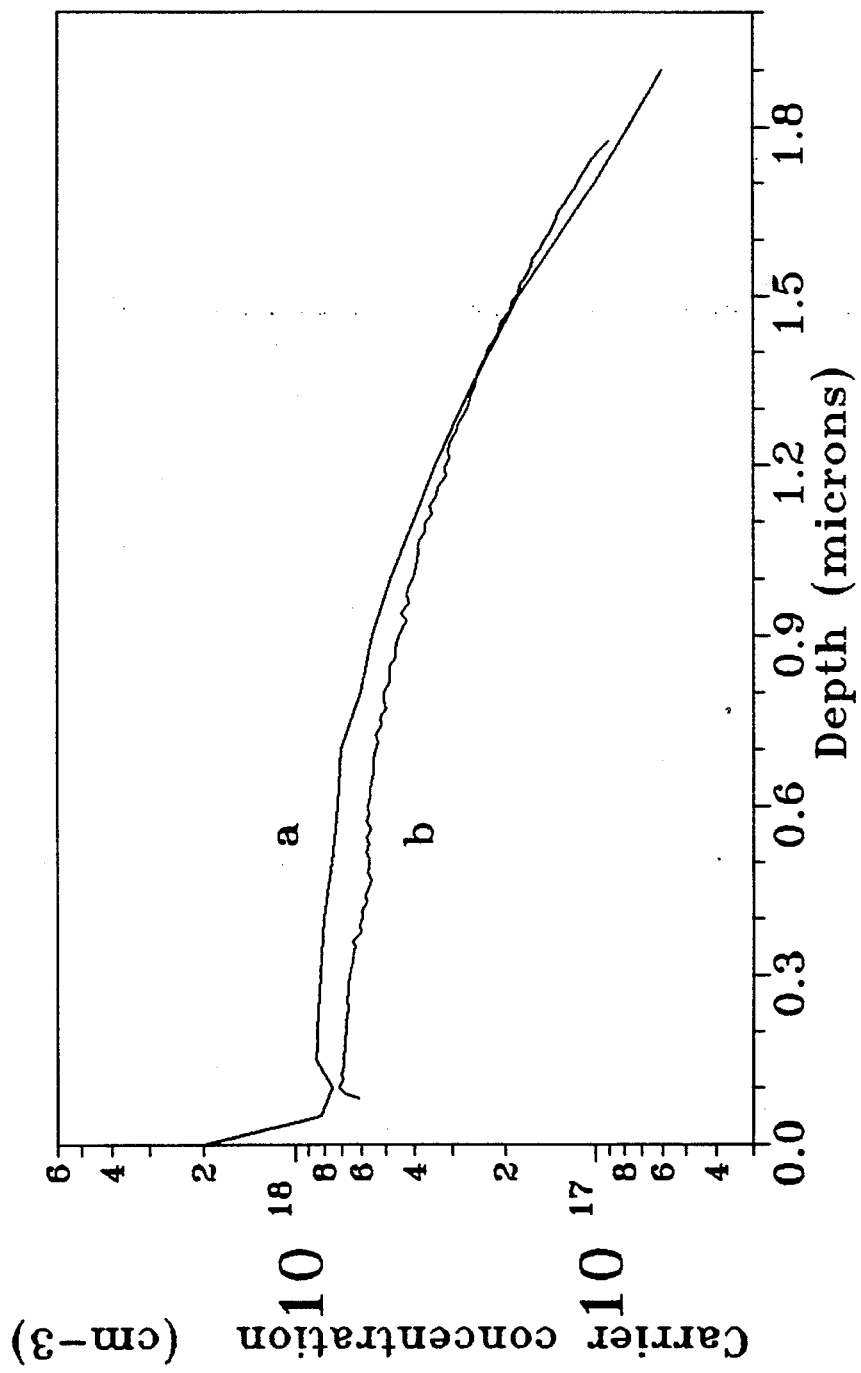
FIGURE 3/1

PROCESS FOR ELECTROCHEMICAL DISSOLUTION OF SEMICONDUCTORS

FIELD OF THE INVENTION

The invention relates to the electrochemical dissolution of semiconductors. More particularly, the invention concerns a method for the electrochemical dissolution of semiconductor materials by alternating application of anodic and cathodic direct currents to an electrode formed by contacting a semiconductor material with an electrolyte.

BACKGROUND ART

It is well known that by contacting a semiconductor material with an electrolyte, an electrode is formed that is in many respects similar to the metal/electrolyte systems. In a suitable electrolyte, by applying anodic potential to the semiconductor/electrolyte electrode, the semiconductor material can be dissolved. For n-type semiconductors, the rate of anodic dissolution is determined by the amount of minority carriers created by illuminating the material. For a p-type semiconductor, high dissolution rates are obtainable without illumination. The electrochemical dissolution can be maintained at a desired rate by control of either the anodic potential or the anodic current.

The semiconductor-to-electrolyte interface is continuously renewed during this dissolution process and, under certain conditions, can be used for the determination of semiconductor characteristics that vary with the depth in the semiconductor. Such characteristics are, for example, the carrier concentration, or the layer thicknesses in multi-layer semiconductor structures, and the measured electrical parameter usually is either the capacitance or the conductance of the depletion layer of the Schottky diode formed at the semiconductor/electrolyte interface.

A method for anodic dissolution of semiconductors and simultaneous determination of their carrier concentration as a function of depth, is described by Ambridge, T. and Factor, M. M. in *J. Appl. Electrochem.* 319 (1975) and by Factor et al., in Current Topics in Materials Science Vol. 6 E. Kaldis, Ed., North-Holland Publ., Amsterdam, 1980. Essentially the same technique is disclosed in the U.S. Pat. Nos. 4,028,207 and 4,168,212. The semiconductor material is dissolved at a fixed potential relative to a calomel reference electrode, and the anodic current is measured between a graphite electrode and the semiconductor as the working electrode. The anodic (dissolution) potential is adjusted to a value providing a sufficiently high anodic current and resultant dissolution rate allowing the determination of the carrier concentration as a function of depth within a reasonable period of time (usually about several hours).

A method and apparatus for determining the layer thickness in multi-layer semiconductor structures by measuring the conductance of the semiconductor/electrolyte interface simultaneously with anodic etching of the semiconductor is disclosed in the U.S. patent application Ser. No. 301,889.

The contents of the U.S. Pat. Nos. 4,028,207 and 4,168,212 and U.S. Ser. No. 301,889 are hereby expressly incorporated by reference.

To ensure that a Schottky barrier is formed at the semiconductor/electrolyte interface, and to allow the reproducible measurement of the desired electrical parameters, the dissolution rate must be the same for the entire surface of the semiconductor, and the formation of any by-product on the semiconductor surface must be avoided.

The quality of the surface obtained by anodic etching of the semiconductor is greatly dependent on the electrolyte composition, as reported by G. E. Cabanies [MRS Spring Meeting 1989, Poster D5.17]. Depending on the chemical composition of the semiconductor material, hydrochloric acid, potassium or sodium hydroxide, Tiron ® (a mixture of sodium fluoride and sulfuric acid), alkaline solutions of disodium ethylenediamine tetraacetate, etc. are most commonly used. The methods known in the art for the anodic dissolution of semiconductor materials try to minimize the irregularities of the semiconductor/electrolyte interface by modification of the electrolyte composition.

However, even if utmost care is taken when choosing the electrolyte composition, the semiconductor/electrolyte interface is often not reproducible and as a result, the dissolution depth calculated from the Faraday equation (this is the basis for the determination of the progress of the electrochemical dissolution) and the measurable depth will be different. A reason for this might be that the dissolution does not take place according to the expected stoichiometry and/or is accompanied by side reactions. The products of such side reactions may be deposited on the semiconductor surface interfering with the reproducibility of the anodic dissolution.

SUMMARY OF THE INVENTION

The present invention relates to a novel process for the electrochemical dissolution of semiconductors, which provides a well defined, reproducible semiconductor/electrolyte interface that is suitable for the reliable determination of various semiconductor characteristics varying with the depth in the semiconductor.

According to the invention, the electrochemical dissolution of a semiconductor material is carried out by alternating application of anodic and cathodic direct currents. In this way, any by-products formed during the anodic dissolution of the semiconductor material are removed in the cathodic phase.

In one aspect, the present invention relates to a process for the electrochemical dissolution of a semiconductor, comprising contacting the semiconductor with an electrolyte suitable for its anodic dissolution, and applying alternately anodic and cathodic direct currents to the interface of the semiconductor with the electrolyte such that the progress of the electrochemical dissolution is determined by the charge applied in the anodic phase.

In another aspect, the present invention concerns a process for the determination of a semiconductor characteristic varying with the depth in a semiconductor as a function of depth, comprising contacting the semiconductor with an electrolyte suitable for its anodic dissolution, applying alternately anodic and cathodic direct currents to the interface of the semiconductor with th electrolyte such that the progress of the electrochemical dissolution is determined by the charge applied in the anodic phase, and simultaneously measuring a parameter proportionate with the semiconductor characteristic to be determined.

BRIEF DESCRIPTION OF THE DRAWING

FIG. 2/1 shows the carrier concentration in a n-GaAlAs/n-GaAs sample as a function of depth, as determined by the traditional method ("a") and the method of the present invention ("b").

FIG. 2/2 shows the topography of the etch crater following electrochemical dissolution by the traditional method ("a") and the method of the invention ("b").

FIG. 3 shows the carrier concentration profiles of a silicon sample as determined by SIMS analysis ("a") and by the method of the present invention ("b").

DETAILED DESCRIPTION OF THE INVENTION

Figure 1:
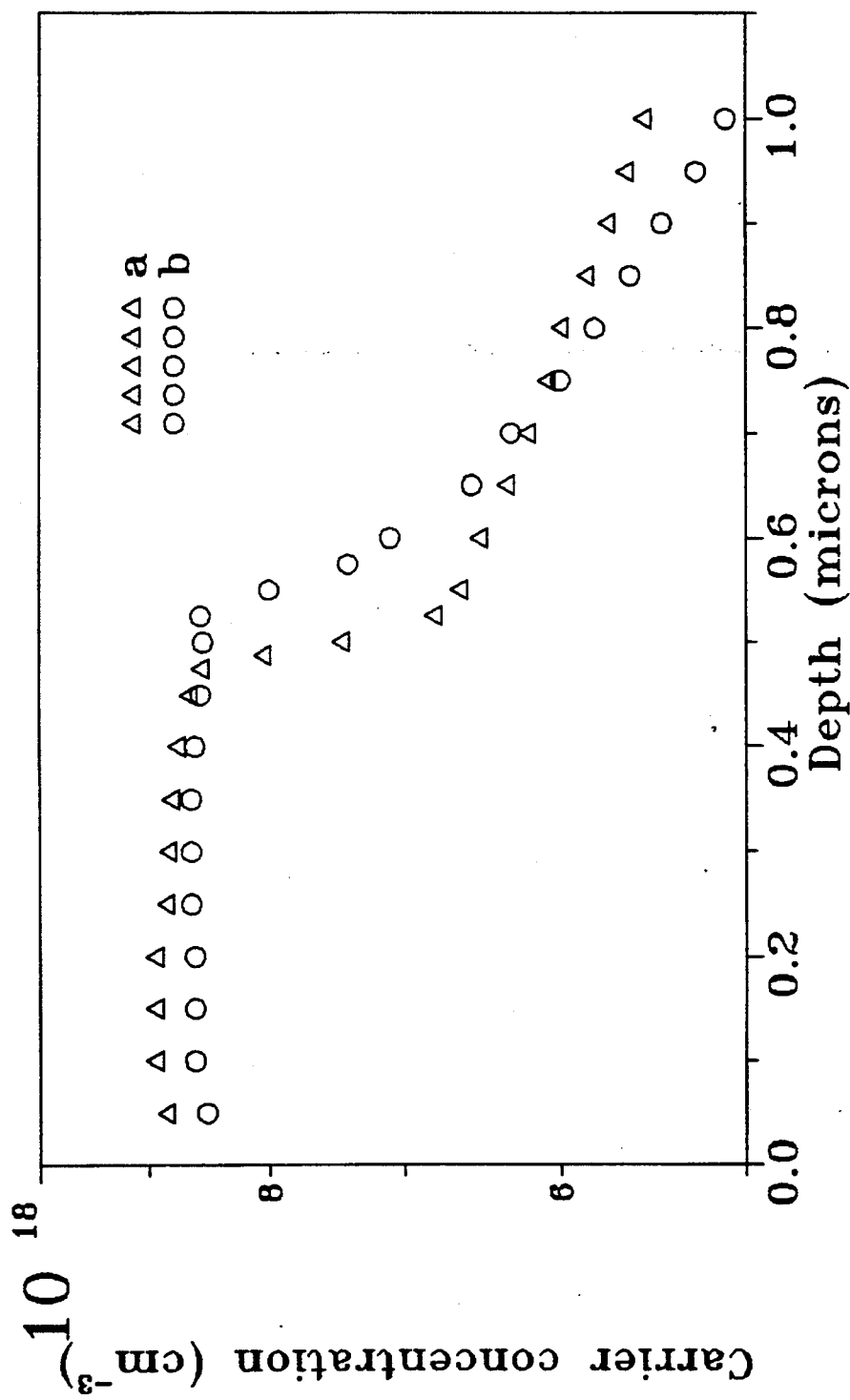
FIG. 1 illustrates the carrier concentration as a function of depth for a p-GaAs/p-GaAlAs semiconductor structure, determined by the conventional anodic dissolution technique ("a") and by the process of the present invention ("b").

The process according to the present invention is suitable for the determination of a characteristic varying with the depth in any semiconductor materials or multi-layer semiconductor structures. The term "semiconductor" is used in a broad sense and includes elementary and compound semiconductors and any bi- or multi-layer structures of such semiconductors.

The semiconductor characteristic may, for example, be the carrier concentration or the thicknesses of the individual layers in a multi-layer semiconductor structure, but the process is suitable for the determination of any characteristics varying with the depth within a semiconductor, via measurement of an electrical parameter proportionate with such semiconductor characteristics.

The process of the present invention can be carried out in any electrical cell suitable for the electrochemical dissolution of semiconductor materials. A typical cell arrangement is, for example, disclosed in the U.S. Pat. Nos. 4,168,212 and 4,028,207, in the Hungarian patent No. 199,020, and in the U.S. patent application Ser. No. 301,889, now U.S. Pat. No. 4,995,939.

Preferably, four electrodes are employed, the semiconductor material being the working electrode. The other two electrodes typically are a carbon electrode, and calomel and platinum reference electrodes.

For p-type semiconductors, the semiconductor material is illuminated to provide an acceptable rate for the cathodic phase. For n-type semiconductors, the rate of the cathodic phase is usually satisfactory without the illumination of the sample, however, illumination was found to have an advantageous effect on the quality of the semiconductor surface (e.g. smoothness, less irregularities, etc.). Therefore, it is preferred to illuminate also n-type semiconductors in the cathodic phase.

It has been found that the efficiency of this process is determined by the ratio of the respective charges passed through the cell during the anodic and cathodic processes. Although the preferred anodic charge/cathodic charge ratio will vary depending on the composition of the semiconductor, it should generally be greater than 1:1, and preferably between about 5:1 and about 500:1. The selection of the preferred ratio for a specific semiconductor sample is well within the skill of a person of ordinary skill in the art.

The invention will further be illustrated by the following non-limiting examples.

EXAMPLE 1

The carrier concentration in a GaAs/GaAlAs semiconductor structure as a function of depth was determined by the conventional electrochemical dissolution process (Ambridge and Faktor, Supra) and by the process according to the present invention, using an electrolytic cell arrangement substantially as described in the U.S. patent application Ser. No. 301,889. The electrolyte was a mixture of a $0.1M/dm^3$ solution of ethylenediaminetetraacetic acid disodium salt and a $0.4M/dm^3$ solution of sodium hydroxide. The profiles obtained by the conventional process ("a") and the process of the present invention ("b") are shown in FIG. 1.

The rate of the electrochemical dissolution was adjusted by control of the current (constant current mode) both in the anodic and in the cathodic phase. Within a cycle, the ratio of the durations of the anodic and cathodic processes was adjusted to 5:2 (anodic process: 50 seconds, cathodic process: 20 seconds), and the anodic charge/cathodic charge ratio was 50:1. In the cathodic phase, the sample was illuminated by a 150 W halogen light source, through a filter, with light of less than 600 nm.

In the course of the conventional electrochemical dissolution of the GaAs/GaAlAs sample, a brownish discoloration was visually observed on the semiconductor surface; probably due to the deposit of elementary As. Such discoloration could be avoided by alternating application of anodic and cathodic direct currents, or the brownish layer, if already formed, was successfully removed by using the process of the present invention.

EXAMPLE 2

For direct comparison of the method according to the present invention with the conventional anodic dissolution method (Ambridge and Factor, Supra), the carrier concentration of an n-GaAlAs/n-GaAs semiconductor sample as a function of depth was determined essentially as described in Example 1. The results are illustrated in FIG. 2/1.

Graph "a" was obtained by anodic direct current only (traditional method), whereas graph "b" was obtained by alternating use of anodic and cathodic direct currents (method of the invention). The rate of the electrochemical dissolution was adjusted in both the anodic and the cathodic period by regulating the current passed through the electrode (in steady current mode). The lengths of the anodic and cathodic phases and the respective currents were chosen to provide a 30:24 anodic phase to cathodic phase ratio (anodic phase: 30 seconds, cathodic phase: 24 seconds), and a 5:1 anodic to cathodic charge ratio. The sample was illuminated as described in Example 1 in both the anodic and the cathodic phases.

The topography of the etch crater was determined following electrochemical dissolution, and the results are shown in FIG. 2/2. The process of the present invention enables a uniform, homogenous dissolution of the sample, therefore, the etch crater is very smooth ("b") as opposed to the surface obtained by the traditional method ("a").

During the traditional process, a brownish discoloration was observed on the surface when the GaAlAs layer was reached. By Auger and SIMS spectroscopy elementary arsenic was detected on the discolored surface. No discoloration was observed with the method of the present invention.

EXAMPLE 3

The carrier concentration of a p-Si semiconductor as a function of depth was determined in an arrangement essentially as described in Example 1, using a mixture of sodium hydroxide (0.5 moles/dm$^{-3}$), sulfuric acid (0.25 moles/dm$^{-3}$) and sodium fluoride (0.06 moles/dm$^{-3}$) (pH 4) as electrolyte. The anodic dissolution of silicon was performed at a constant voltage of 3.4 V (related to saturated calomel reference electrode). The lengths of the anodic and cathodic periods and the value of the cathodic current (about 2 $\mu$A) were elected to provide a 90:20 anodic to cathodic phase ratio (anodic phase: 90 seconds; cathodic phase: 20 seconds) and a 100:1 anodic to cathodic charge ratio within one period.

During the cathodic phase, the sample was illuminated as described in Example 1. The carrier concentration profiles in the silicon sample as a function of depth as determined by SIMS analysis ("a") and the process of the present invention ("b") are shown in FIG. 3. The good agreement between the two profiles shows the applicability of the process of the present invention for carrier concentration determination in silicon samples.

The foregoing description details specific techniques that can be employed to practice the present invention, and represents the best mode contemplated. However, it is apparent for one of ordinary skill in the art that numerous variations are possible without deviating from the basic concept of the invention. Thus, however detailed the foregoing may appear in text, it should not be construed as limiting the overall scope hereof; rather, the ambit of the present invention is to be governed only by the lawful construction of the appended claims.

We claim:

1. A process for the electrochemical dissolution of a semiconductor that may be n-type or p-type, comprising contacting said semiconductor with an electrolyte suitable for its anodic dissolution and applying alternately anodic and cathodic direct currents to the interface of said semiconductor with said electrolyte such that the progress of the electrochemical dissolution is determined exclusively by the charge applied in the anodic process.

2. The process according to claim 1 wherein within an anodic-cathodic cycle, the anodic charge/cathodic charge ratio is greater than 1:1.

3. The process according to claim 2 wherein said ratio is between about 5:1 and about 500:1.

4. The process according to claim 1 wherein the semiconductor surface contacted with said electrolyte is illuminated during the cathodic dissolution process.

5. The process according to claim 1 wherein said semiconductor comprises a compound semiconductor.

6. The process according to claim 5 wherein compound semiconductor is selected from the group consisting of GaAs and GaAlAs.

7. The process according to claim 6 wherein is semiconductor is a GaAs/GaAlAs bi-layer semiconductor structure.

8. The process according to claim 1 wherein said electrolytic dissolution is performed in a constant current mode.

9. The process according to claim 1, wherein said electrochemical dissolution is continuously and controllably determined exclusively by said charge applied in said anodic process.

10. A process for the determination of a semiconductor characteristic varying with the depth in a semiconductor that may be n-type or p-type, as a function of depth, comprising contacting said semiconductor with an electrolyte suitable for its anodic dissolution, applying alternately anodic and cathodic direct currents to the interface of the semiconductor with said electrolyte such that the progress of said electrochemical dissolution is determined by the charge applied in the anodic phase, and simultaneously measuring a parameter proportionate with said semiconductor characteristic to be determined.

11. The process according to claim 10 wherein within an anodic-cathodic cycle, the anodic charge/cathodic charge ratio is greater than 1:1.

12. The process according to claim 11 wherein said ratio is between about 5:1 and about 500:1.

13. The process according to claim 10 wherein the semiconductor surface contacted with said electrolyte is illuminated during the cathodic dissolution process.

14. The process according to claim 10 wherein said semiconductor comprises a compound semiconductor.

15. The process according to claim 14 wherein compound semiconductor is selected from the group consisting of GaAs and GaAlAs.

16. The process according to claim 15 wherein is semiconductor is a GaAs/GaAlAs bi-layer semiconductor structure.

17. The process according to claim 16 wherein within an anodic-cathodic cycle, the anodic charge/cathodic charge ratio is about 50:1.

18. The process according to claim 10 wherein said electrolytic dissolution is performed in a constant current mode.

19. The process according to claim 10 wherein said semiconductor characteristic is the carrier concentration.

20. The process according to claim 19 wherein said parameter is the capacitance of the depletion layer formed at the semiconductor/electrolyte interface.

21. The process according to claim 10 wherein said semiconductor is a multi-layer structure, and said characteristic is the layer thickness.

22. The process according to claim 10 wherein said parameter is the conductance.

23. The process according to claim 10 wherein said semiconductor is a compound semiconductor, and said parameter is the chemical composition.

24. The process according to claim 10, wherein said progress of said electrochemical dissolution is continuously and controllably determined exclusively by said charge applied in said anodic phase.

* * * * *